US012696518B2

(12) United States Patent　　　(10) Patent No.: US 12,696,518 B2
Nishi et al.　　　　　　　　　　　(45) Date of Patent:　　　Jul. 28, 2026

(54) SEMICONDUCTOR DEVICE AND METHOD OF MANUFACTURING THE SAME

(71) Applicant: Mitsubishi Electric Corporation, Tokyo (JP)

(72) Inventors: Koichi Nishi, Tokyo (JP); Kosuke Sakaguchi, Tokyo (JP); Kazuya Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 384 days.

(21) Appl. No.: 18/352,838

(22) Filed: Jul. 14, 2023

(65) Prior Publication Data

US 2024/0113189 A1　　Apr. 4, 2024

(30) Foreign Application Priority Data

Oct. 4, 2022　(JP) ................................. 2022-160150

(51) Int. Cl.
　　*H10D 64/27*　　　(2025.01)
　　*H10D 12/00*　　　(2025.01)
　　(Continued)

(52) U.S. Cl.
　　CPC ......... *H10D 64/519* (2025.01); *H10D 12/021* (2025.01); *H10D 12/038* (2025.01);
　　(Continued)

(58) Field of Classification Search
　　CPC .. H10D 64/519; H10D 12/021; H10D 12/038; H10D 12/211; H10D 12/481;
　　(Continued)

(56) References Cited

U.S. PATENT DOCUMENTS

2016/0351561 A1* 12/2016 Senoo ................... H10D 62/129
2017/0148785 A1* 5/2017 Hirabayashi ......... H10D 12/211
(Continued)

FOREIGN PATENT DOCUMENTS

JP　　2012-043890 A　　3/2012
JP　　2017-098344 A　　6/2017
(Continued)

OTHER PUBLICATIONS

"Notice of Reasons for Refusal" Office Action issued in JP 2022-160150; mailed by the Japanese Patent Office on Jul. 22, 2025.

*Primary Examiner* — Syed I Gheyas
(74) *Attorney, Agent, or Firm* — Studebaker Brackett PLLC

(57) ABSTRACT

An adjacent active trench in an IGBT region and an adjacent capacitance adjustment trench in a diode region are each provided in a stripe shape extending in a Y direction in a plan view. Each of a plurality of crossing trenches extends in an X direction orthogonal to the Y direction in a plan view and is provided in a stripe shape. Each of the plurality of crossing trenches is provided from the adjacent capacitance adjustment trench to the adjacent active trench in a plan view. Therefore, the gate electrode of the adjacent active trench and the capacitance adjustment electrode of the adjacent capacitance adjustment trench are electrically connected via the electrode for the crossing trench in the crossing trench.

9 Claims, 8 Drawing Sheets

(51) Int. Cl.
　H10D 12/01 　　(2025.01)
　H10D 64/01 　　(2025.01)

(52) U.S. Cl.
　CPC ......... H10D 12/211 (2025.01); H10D 12/481 (2025.01); H10D 64/01 (2025.01); H10D 64/513 (2025.01)

(58) Field of Classification Search
　CPC .... H10D 64/513; H10D 8/422; H10D 62/126; H10D 62/127
　See application file for complete search history.

(56)　　　　　　　　References Cited

U.S. PATENT DOCUMENTS

| | | | |
|---|---|---|---|
| 2020/0105745 A1* | 4/2020 | Obata | H10D 12/481 |
| 2021/0265491 A1* | 8/2021 | Soneda | H10D 12/481 |
| 2022/0122966 A1* | 4/2022 | Nishi | H10D 64/117 |
| 2022/0139908 A1 | 5/2022 | Obata et al. | |
| 2024/0021607 A1 | 1/2024 | Obata et al. | |

FOREIGN PATENT DOCUMENTS

| | | |
|---|---|---|
| JP | 2021-192447 A | 12/2021 |
| JP | 2022-067730 A | 5/2022 |

* cited by examiner

F I G. 1
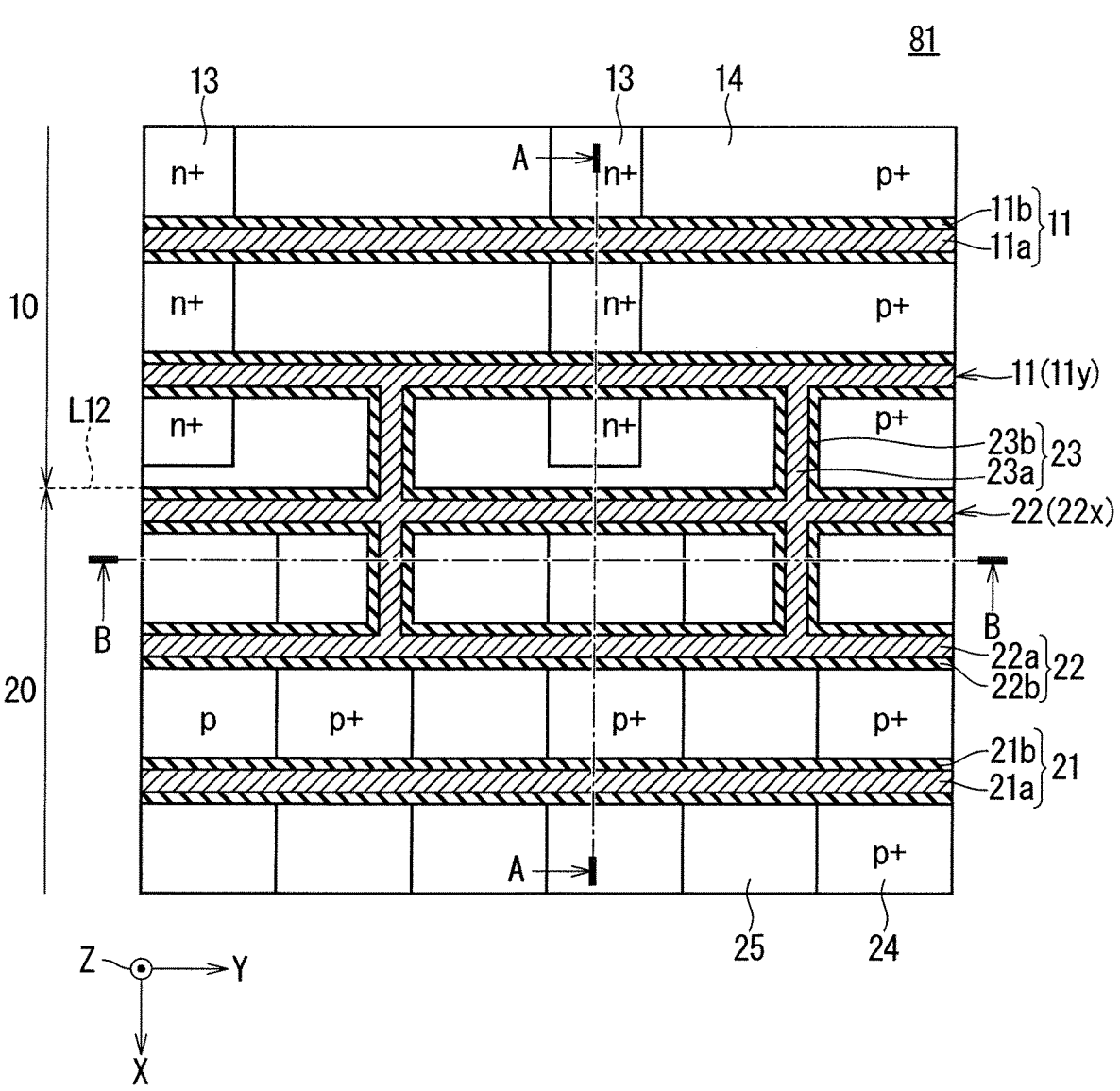

F I G. 2
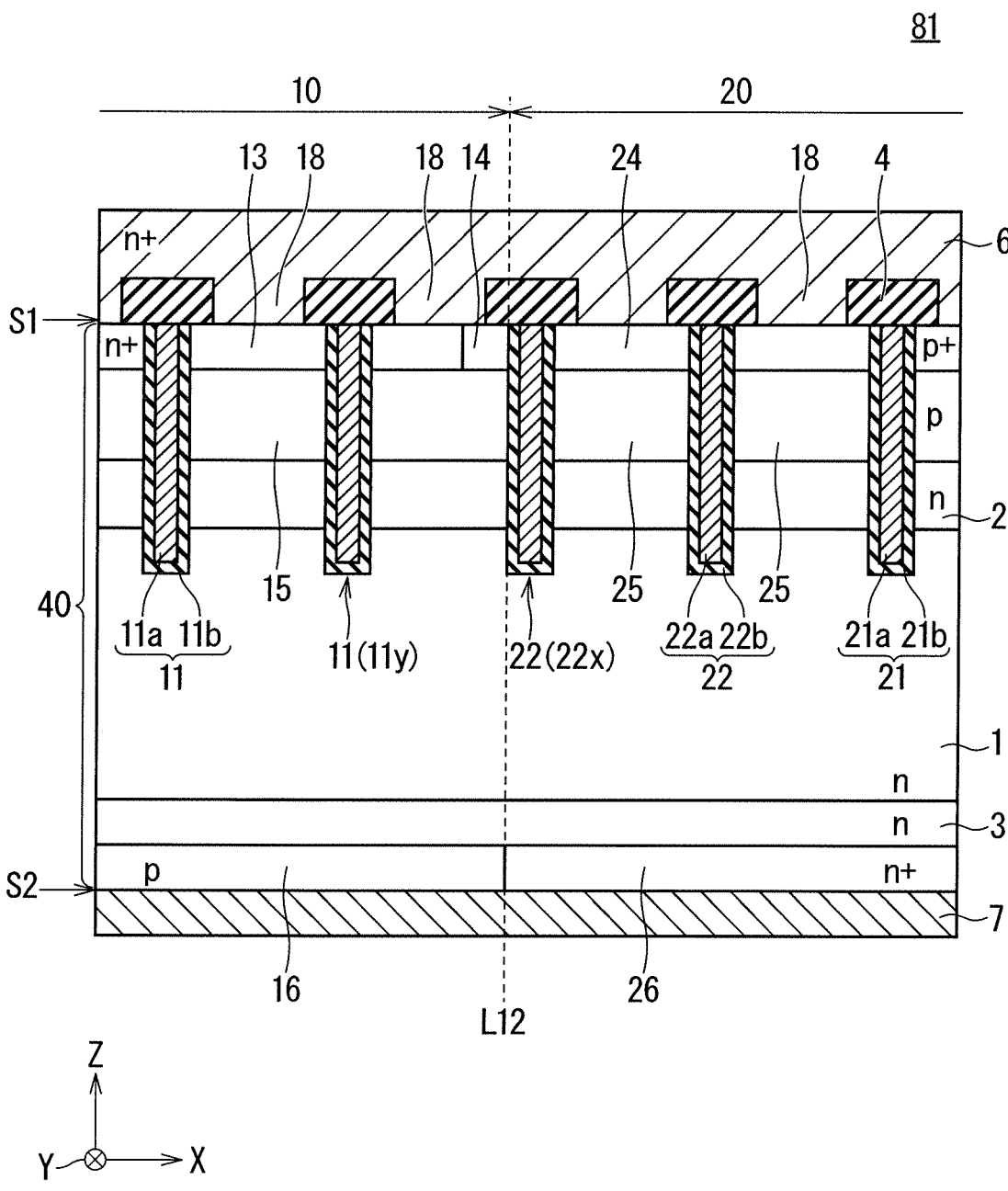

F I G. 3
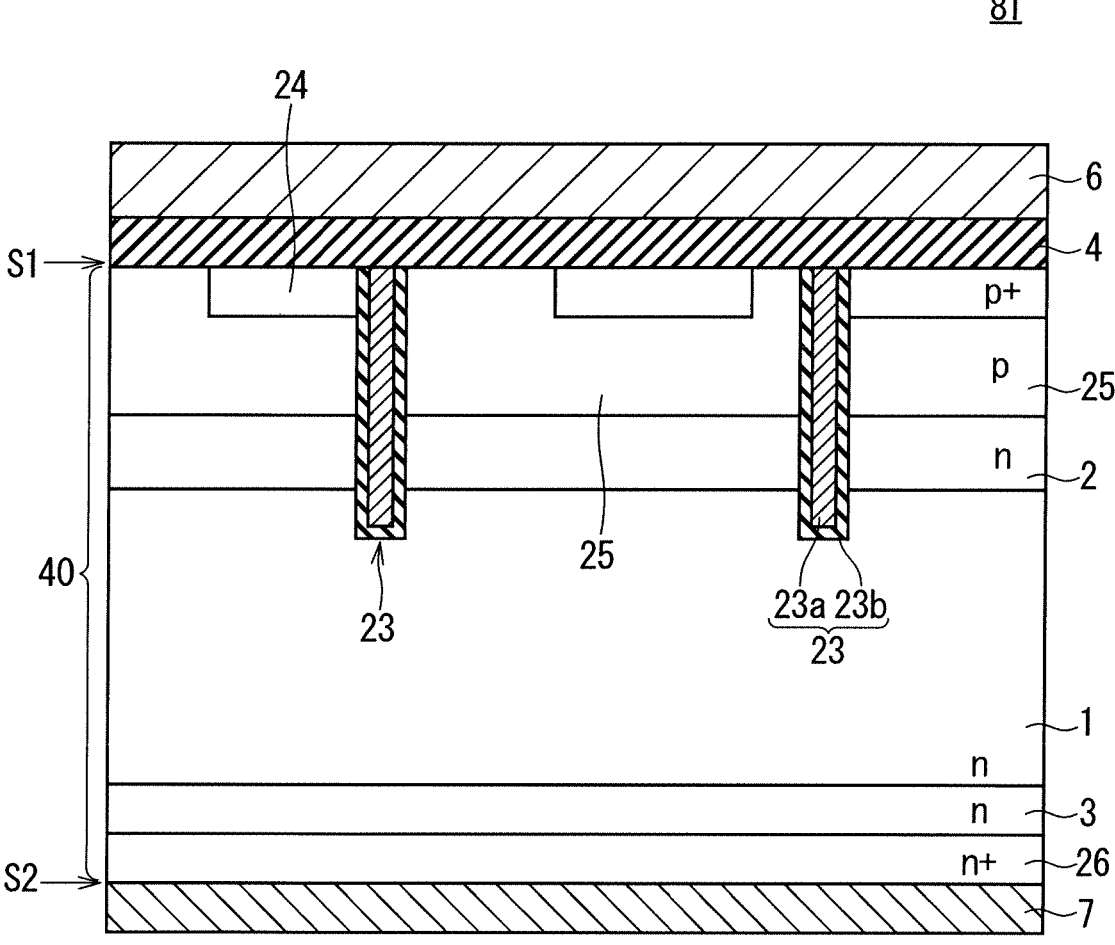
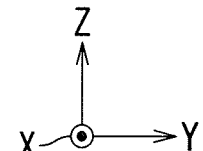

F I G. 4
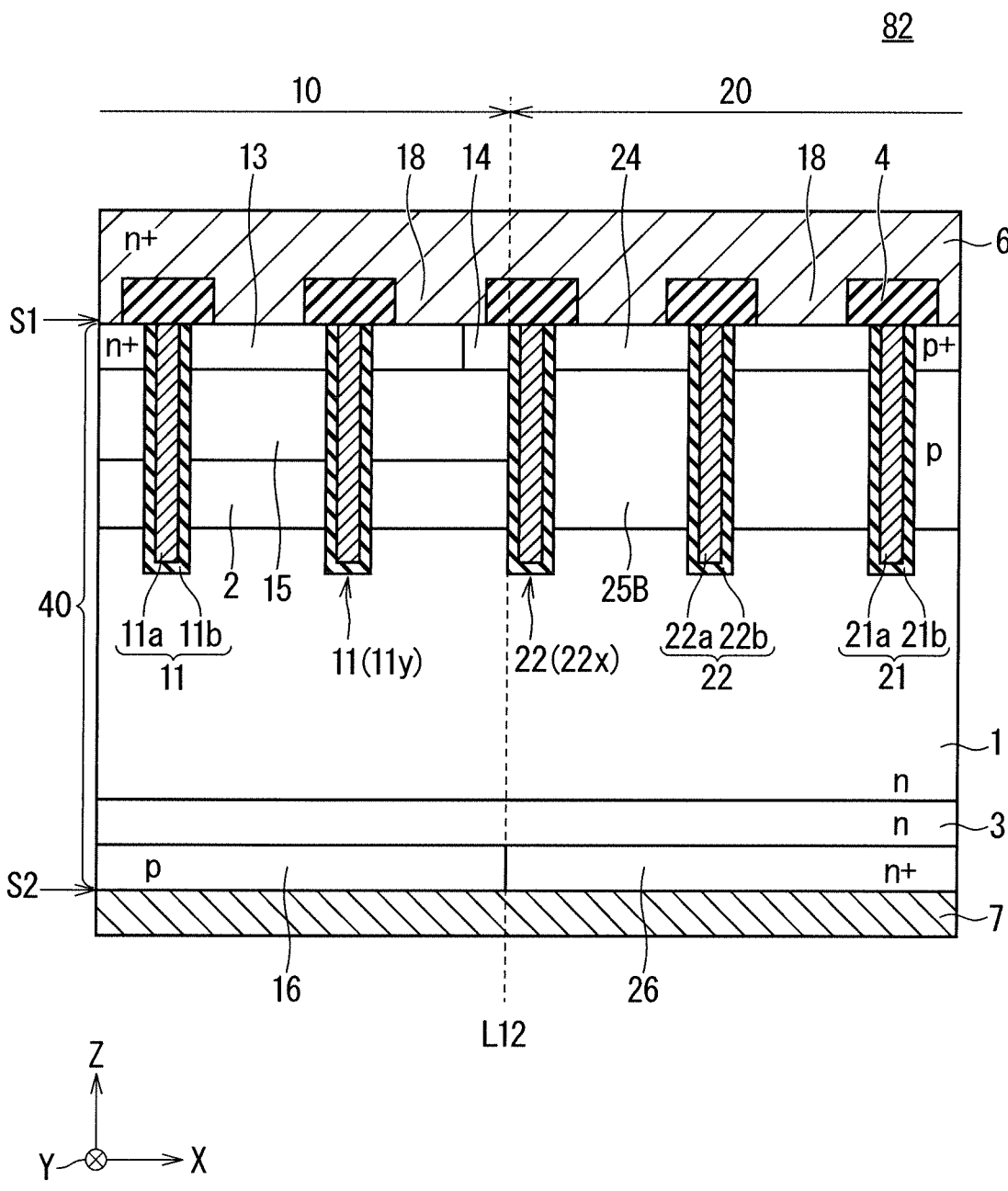

F I G. 5
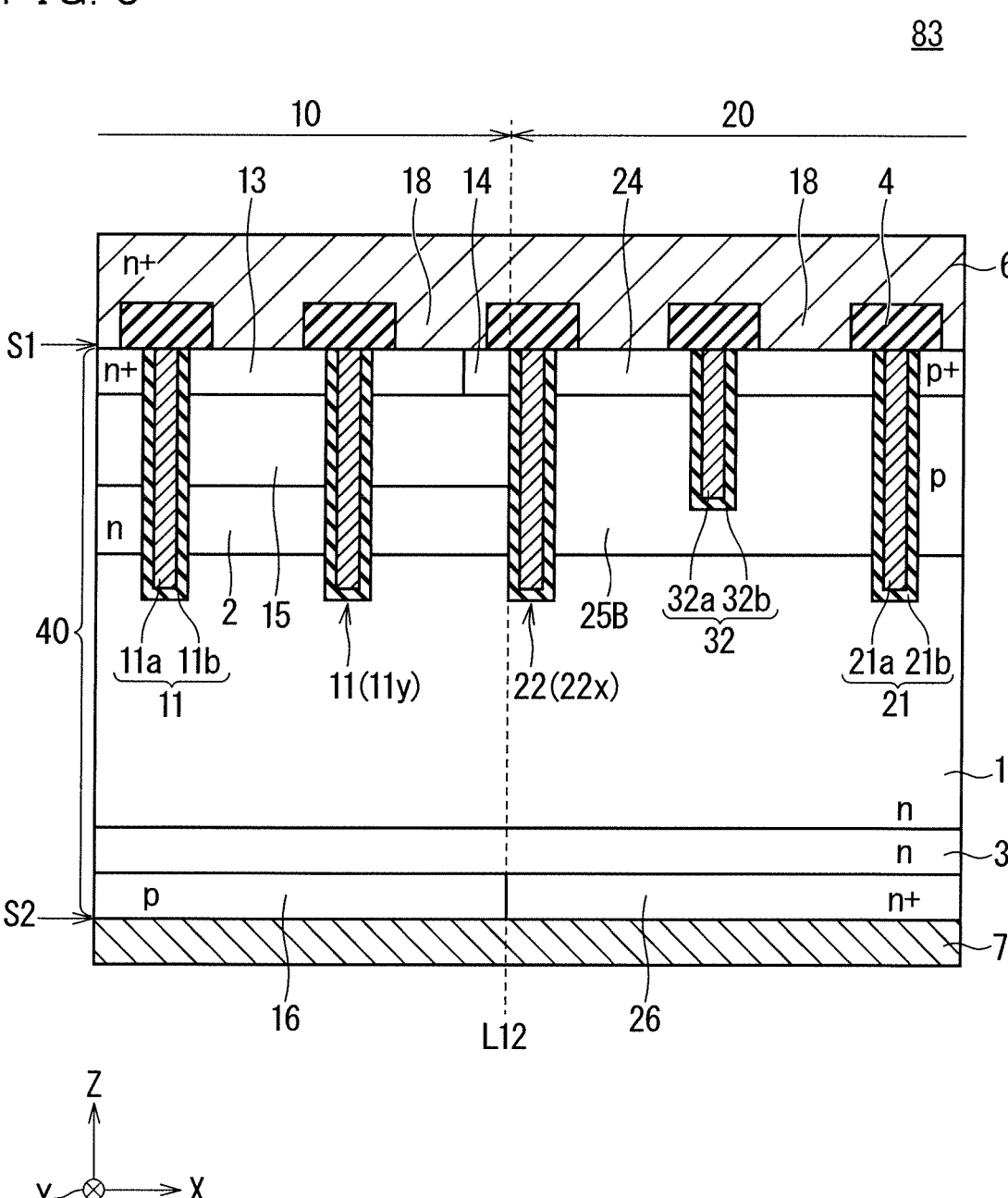

F I G. 6
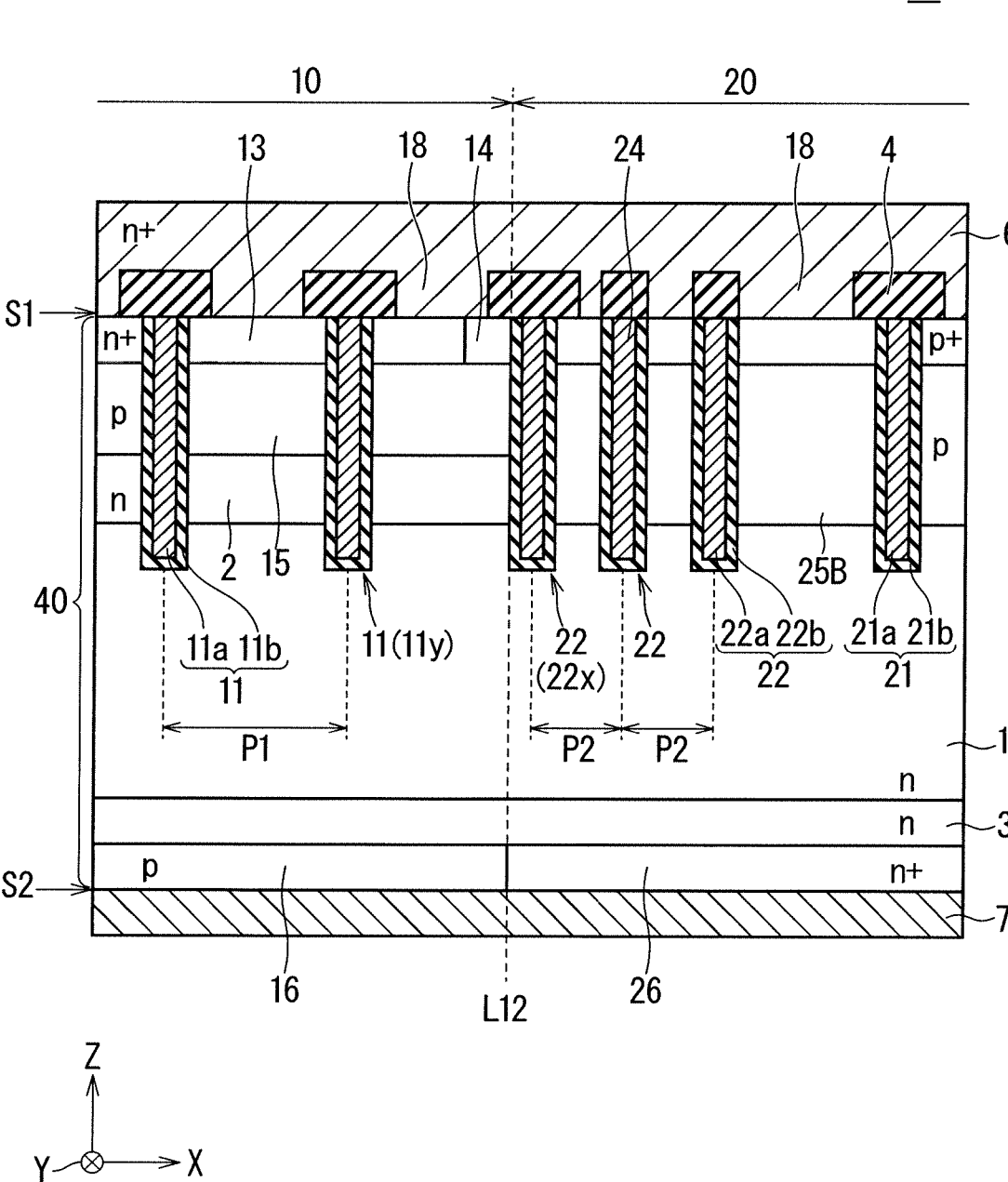

F I G. 7
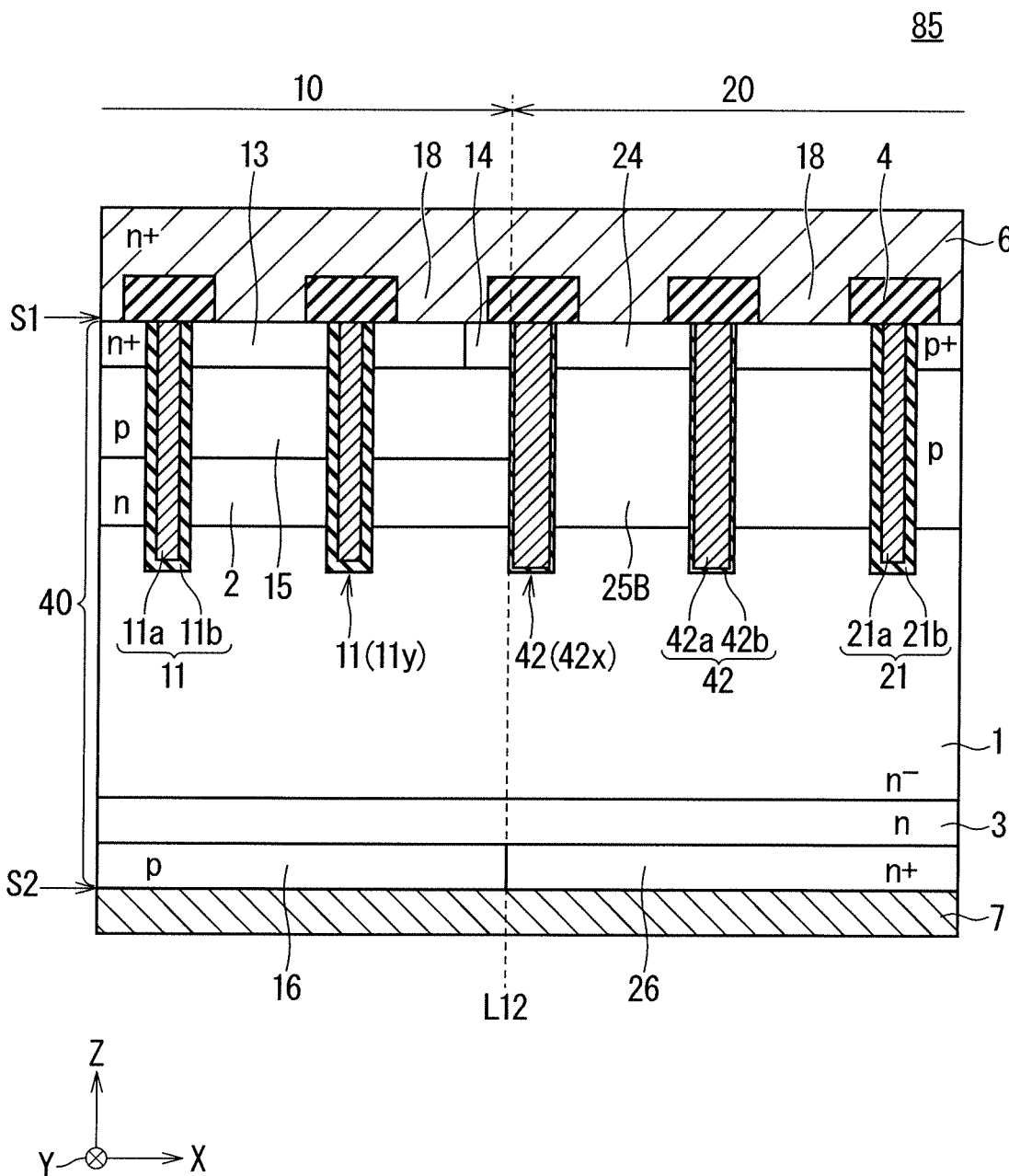

F I G. 8
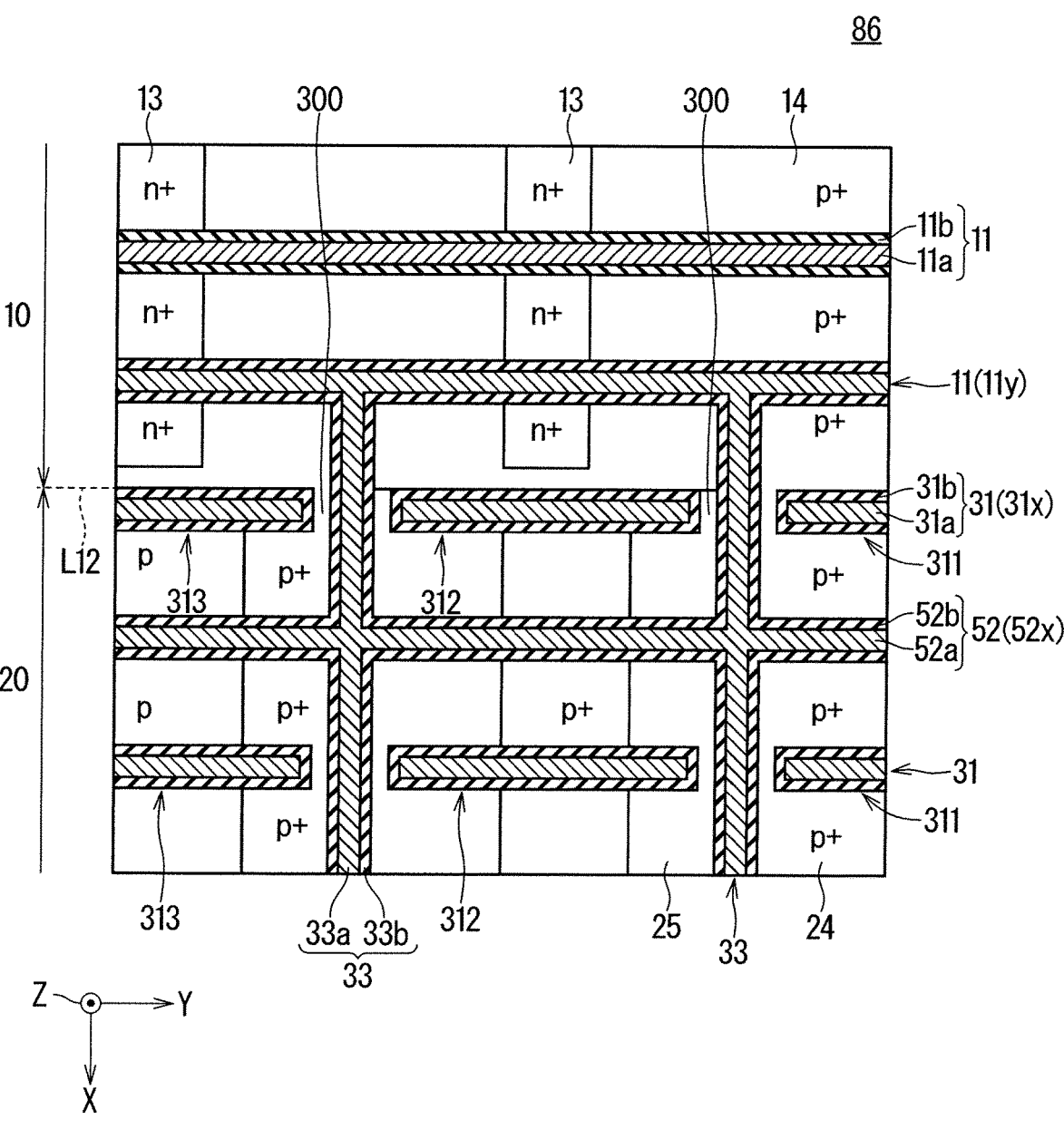

SEMICONDUCTOR DEVICE AND METHOD OF MANUFACTURING THE SAME

BACKGROUND OF THE INVENTION

Field of the Invention

The present disclosure relates to a semiconductor device including an IGBT region and a diode region, and a method of manufacturing the same.

Description of the Background Art

In order to improve performance and reduce cost of a power semiconductor device, a reverse conducting insulated gate bipolar transistor (RC-IGBT) and the like have been developed. Hereinafter, the reverse conducting insulated gate bipolar transistor will be referred to as an "RC-IGBT". The RC-IGBT is a semiconductor device capable of bidirectionally energizing, and for example, a semiconductor device in which an IGBT and a diode are integrated in the same semiconductor substrate.

As an RC-IGBT, for example, Japanese Patent Application Laid-Open No. 2012-43890 proposes a structure in which a capacitance is adjusted using a trench provided in a diode region. An electrode material is embedded in the trench via an insulating film. Japanese Patent Application Laid-Open No. 2012-43890 employs a gate connection structure in which the trench in the diode region is pulled up at a gate wiring portion formed on a semiconductor substrate and connected to a gate potential of an IGBT.

In the conventional gate connection structure disclosed in Japanese Patent Application Laid-Open No. 2012-43890 and the like, when the total number of the plurality of trenches formed in the diode region is increased, it is necessary to provide a connection region with the gate pull-up portion in each of the plurality of trenches, and the number of connection regions with the gate pull-up portion also increases. The connection region of each of the plurality of trenches is usually provided at the end.

Therefore, the conventional gate connection structure has a structure in which the electric field concentration is likely to occur in the connection region with the gate pull-up portion. Therefore, since the conventional gate connection structure functions to increase the gate leakage current, there is a problem that the gate leakage current increases when the number of trenches provided in the diode region is increased for the purpose of increasing the input capacitance. Specifically, the input capacitance means a total value of the gate-emitter capacitance Cge and the gate-collector capacitance Cgc of the IGBT.

SUMMARY

The present disclosure has been made to solve the above problems, and an object of the present disclosure is to obtain a semiconductor device having a structure that increases an input capacitance of an IGBT and suppresses a gate leakage current.

A semiconductor device according to the present disclosure includes an IGBT region having an IGBT therein and a diode region having a diode therein.

The semiconductor device includes a semiconductor substrate, a drift layer of a first conductivity type, a base layer of a second conductivity type, an anode layer of the second conductivity type, and an emitter electrode.

The semiconductor substrate has first and second main surfaces.

The drift layer is provided in the semiconductor substrate.

The base layer is provided in the semiconductor substrate and selectively disposed on a first main surface side with respect to the drift layer.

The anode layer is provided in the semiconductor substrate and selectively disposed on the first main surface side with respect to the drift layer.

The emitter electrode is provided on the first main surface of the semiconductor substrate.

The drift layer and the emitter electrode are shared between the IGBT region and the diode region, the base layer is used in the IGBT region, and the anode layer is used in the diode region.

The semiconductor device further includes an active trench, a diode trench, a capacitance adjustment trench, and a crossing trench.

The active trench is provided in a region that penetrates the base layer from the first main surface side and reaches a part of the drift layer.

The diode trench is provided in a region that penetrates the anode layer from the first main surface side and reaches a part of the drift layer.

The capacitance adjustment trench is provided from the first main surface side to at least a part of the anode layer.

The crossing trench is provided in a region that penetrates the base layer or the anode layer from the first main surface side and reaches a part of the drift layer.

The crossing trench is shared between the IGBT region and the diode region, the active trench is used in the IGBT region, and the diode trench and the capacitance adjustment trench are used in the diode region.

A gate electrode is embedded in the active trench via a gate insulating film.

A diode electrode is embedded in the diode trench via a diode insulating film.

A capacitance adjustment electrode is embedded in the capacitance adjustment trench via a capacitance adjustment insulating film.

An electrode for the crossing trench is embedded in the crossing trench via an insulating film for the crossing trench.

The diode electrode is electrically connected to the emitter electrode.

The crossing trench is provided from the capacitance adjustment trench to the active trench in a plan view, and the gate electrode and the capacitance adjustment electrode are electrically connected via the electrode for the crossing trench.

In the semiconductor device of the present disclosure, the gate electrode provided in the IGBT region is electrically connected to the capacitance adjustment electrode provided in the diode region via the electrode for the crossing trench provided in the semiconductor substrate.

Therefore, the semiconductor device of the present disclosure can increase the input capacitance of the IGBT and suppress the gate leakage current without increasing the number of active trenches.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view illustrating a planar structure of a semiconductor device according to a first preferred embodiment of the present disclosure;

FIG. 2 is a cross-sectional view illustrating an A-A cross-sectional structure of FIG. 1;

FIG. 3 is a cross-sectional view illustrating a B-B cross-sectional structure of FIG. 1;

FIG. 4 is a cross-sectional view illustrating a cross-sectional structure of a semiconductor device according to a second preferred embodiment of the present disclosure;

FIG. 5 is a cross-sectional view illustrating a cross-sectional structure of a semiconductor device according to a third preferred embodiment of the present disclosure;

FIG. 6 is a cross-sectional view illustrating a cross-sectional structure of a semiconductor device according to a fourth preferred embodiment of the present disclosure;

FIG. 7 is a cross-sectional view illustrating a cross-sectional structure of a semiconductor device according to a fifth preferred embodiment of the present disclosure; and FIG. 8 is a plan view illustrating a planar structure of a semiconductor device according to a sixth preferred embodiment of the present disclosure.

DESCRIPTION OF THE PREFERRED EMBODIMENTS

Introduction

Hereinafter, first to sixth preferred embodiments will be described with reference to the drawings. Since the drawings are schematically illustrated, the interrelationship in terms of size and position may vary. In the following description, the same or corresponding constituent elements are denoted by the same reference numerals, and repeated description may be omitted. In the following description, terms indicating specific positions and directions, such as "upper", "lower", "side", "bottom", "front", or "back", may be used, but these terms are used for convenience to facilitate understanding of the preferred embodiments, and do not limit the directions in actual implementation. The conductivity type of the semiconductor will be described assuming that the first conductivity type is n-type and the second conductivity type is p-type. However, in an opposite manner, the first conductivity type may be p-type and the second conductivity type may be n-type. The $n^+$-type has a higher donor impurity concentration than the n-type, and the $n^-$-type has a lower donor impurity concentration than the n-type. Similarly, the $p^+$-type has a higher acceptor impurity concentration than the p-type, and the $p^-$-type has a lower acceptor impurity concentration than the p-type.

First Preferred Embodiment

FIG. 1 is a plan view illustrating a planar structure of a semiconductor device 81 according to a first preferred embodiment of the present disclosure as viewed from above. FIG. 2 is a cross-sectional view illustrating an A-A cross-sectional structure of FIG. 1, and FIG. 3 is a cross-sectional view illustrating a B-B cross-sectional structure of FIG. 1. An XYZ orthogonal coordinate system is illustrated in each of FIGS. 1 to 3. In FIG. 1, illustration of an interlayer insulating film 4 and an emitter electrode 6, which are structures on the upper surface of a semiconductor substrate 40, is omitted.

As illustrated in FIGS. 1 to 3, the semiconductor device 81 according to the first preferred embodiment of the present disclosure includes the semiconductor substrate 40. The semiconductor device 81 according to the first preferred embodiment includes an insulated gate bipolar transistor (IGBT) region 10 having an IGBT therein and a diode region 20 having a diode therein.

The semiconductor substrate 40 has a first main surface S1 which is a first main surface on the +Z direction side and a second main surface S2 which is a second main surface on the −Z direction side facing the first main surface S1. Further, the semiconductor substrate 40 is divided into the IGBT region 10 and the diode region 20.

The semiconductor substrate 40 is provided with an $n^-$-type drift layer 1 and an n-type carrier accumulation layer 2 which are of the first conductivity type. The carrier accumulation layer 2 is provided on the upper surface of the drift layer 1. That is, the carrier accumulation layer 2 is provided adjacent to the drift layer 1 on the first main surface S1 side. The combination structure of the drift layer 1 and the carrier accumulation layer 2 functions as a drift layer in a broad sense.

The semiconductor substrate 40 is further provided with a p-type base layer 15 and a p-type anode layer 25 which are of the second conductivity type.

The base layer 15 is formed on the upper surface of the carrier accumulation layer 2 in the IGBT region 10. That is, the base layer 15 is selectively disposed on the first main surface S1 side of the semiconductor substrate 40 with respect to the drift layer 1. The base layer 15 is provided in the IGBT region 10.

The anode layer 25 is formed on the upper surface of the carrier accumulation layer 2 in the diode region 20. That is, the anode layer 25 is selectively disposed on the first main surface S1 side of the semiconductor substrate 40 with respect to the drift layer 1. The anode layer 25 is provided in the diode region 20.

The upper surfaces of the base layer 15 and the anode layer 25 on the +Z direction side become the first main surface S1 of the semiconductor substrate 40.

The IGBT region 10 extends from the first main surface S1 to the second main surface S2 of the semiconductor substrate 40. The diode region 20 also extends from the first main surface S1 to the second main surface S2 of the semiconductor substrate 40.

As illustrated in FIG. 2, an $n^+$-type emitter layer 13, a $p^+$-type IGBT contact layer 14, and an active trench 11 are present in the IGBT region 10.

As illustrated in FIGS. 1 and 2, in the IGBT region 10, a $p^+$-type IGBT contact layer 14 and an $n^+$-type emitter layer 13 are selectively provided in an upper layer portion of the base layer 15.

On the other hand, as illustrated in FIGS. 1 to 3, in the diode region 20, a $p^+$-type diode contact layer 24 is selectively provided in an upper layer portion of the anode layer 25.

As illustrated in FIG. 2, regarding the IGBT region 10, a plurality of active trenches 11 are provided in the region where the emitter layer 13 is formed. Each of the plurality of active trenches 11 is provided in a region that penetrates the base layer 15 and the carrier accumulation layer 2 from the first main surface S1 side of the semiconductor substrate 40 and reaches a part of the drift layer 1.

A gate electrode 11a is embedded in each of the plurality of active trenches 11 via a gate insulating film 11b. The gate insulating film 11b is formed on the inner wall of the active trench 11. Hereinafter, in the description of the device structure, regarding the active trench 11, the completed structure including the gate electrode 11a and the gate insulating film 11b may be simply referred to as "active trench 11".

As illustrated in FIG. 1, each of the plurality of active trenches 11 is provided in a stripe shape extending in the Y direction in a plan view.

As illustrated in FIGS. 1 to 3, a diode trench 21 and a plurality of capacitance adjustment trenches 22 are provided in the diode region 20. Although only one diode trench 21 is illustrated in FIGS. 1 and 2, a plurality of diode trenches 21 may be provided in the diode region 20.

As illustrated in FIG. 2, each of the plurality of diode trenches 21 is provided in a region that penetrates the anode layer 25 and the carrier accumulation layer 2 from the first main surface S1 side of the semiconductor substrate 40 and reaches a part of the drift layer 1.

A diode electrode 21*a* is embedded in the diode trench 21 via the diode insulating film 21*b*. The diode insulating film 21*b* is formed on the inner wall of the diode trench 21. Hereinafter, in the description of the device structure, regarding the diode trench 21, the completed structure including the diode electrode 21*a* and the diode insulating film 21*b* may be simply referred to as "diode trench 21".

Furthermore, as illustrated in FIG. 2, each of the plurality of capacitance adjustment trenches 22 is provided in a region that penetrates the anode layer 25 and the carrier accumulation layer 2 from the first main surface S1 side of the semiconductor substrate 40 and reaches a part of the drift layer 1.

In each of the plurality of capacitance adjustment trenches 22, a capacitance adjustment electrode 22*a* is embedded via a capacitance adjustment insulating film 22*b*. The capacitance adjustment insulating film 22*b* is formed on the inner wall of the capacitance adjustment trench 22. Hereinafter, in the description of the device structure, regarding the capacitance adjustment trench 22, the completed structure including the capacitance adjustment electrode 22*a* and the capacitance adjustment insulating film 22*b* may be simply referred to as a "capacitance adjustment trench 22".

As illustrated in FIGS. 1 and 2, among the plurality of capacitance adjustment trenches 22, one capacitance adjustment trench 22 is provided near the boundary L12 between the IGBT region 10 and the diode region 20, and this capacitance adjustment trench 22 becomes the adjacent capacitance adjustment trench 22*x*. On the other hand, the active trench 11 provided in the position closest to the boundary L12 among the plurality of active trenches 11 is the adjacent active trench 11*y*.

In addition, as illustrated in FIG. 3, in the diode region 20, each of the plurality of crossing trenches 23 is provided in a region that penetrates the anode layer 25 and the carrier accumulation layer 2 from the first main surface S1 side of the semiconductor substrate 40 and reaches a part of the drift layer 1. Note that, in the IGBT region 10, each of the plurality of crossing trenches 23 is provided in a region that penetrates the base layer and the carrier accumulation layer 2 from the first main surface S1 side of the semiconductor substrate 40 and reaches a part of the drift layer 1.

An electrode 23*a* for the crossing trench is embedded in each of the plurality of crossing trenches 23 via the insulating film 23*b* for the crossing trench. The capacitance adjustment insulating film 22*b* is formed on the inner wall of the crossing trench 23. Hereinafter, in the description of the device structure, regarding the crossing trench 23, the completed structure including the electrode 23*a* for the crossing trench and the insulating film 23*b* for the crossing trench may be simply referred to as a "crossing trench 23".

As illustrated in FIG. 1, the diode trench 21 extends in the Y direction in a plan view and is provided in a stripe shape.

Similarly, each of the plurality of capacitance adjustment trenches 22 extends in the Y direction in a plan view and is provided in a stripe shape.

On the other hand, each of the plurality of crossing trenches 23 extends in the X direction orthogonal to the Y direction in a plan view and is provided in a stripe shape. Specifically, each of the plurality of crossing trenches 23 is provided from the adjacent capacitance adjustment trench 22*x* to the adjacent active trench 11*y* in a plan view, and the electrode 23*a* for the crossing trench and the gate electrode 11*a* of the adjacent active trench 11*y* are in contact with each other, and the electrode 23*a* for the crossing trench and the capacitance adjustment electrode 22*a* of the adjacent capacitance adjustment trench 22*x* are in contact with each other.

Therefore, the gate electrode 11*a* of the adjacent active trench 11*y* and the capacitance adjustment electrode 22*a* of the adjacent capacitance adjustment trench 22*x* are electrically connected via the electrode 23*a* for the crossing trench in the crossing trench 23.

In addition, the crossing trench 23 is also provided between the pair of capacitance adjustment trenches 22, 22 arranged adjacent to each other in a plan view, and the electrode 23*a* for the crossing trench and each of the pair of capacitance adjustment electrodes 22*a*, 22*a* are in contact with each other. Therefore, the pair of capacitance adjustment electrodes 22*a* is electrically connected via the electrode 23*a* for the crossing trench.

Note that, even when three or more capacitance adjustment trenches 22 are formed, the plurality of capacitance adjustment trenches 22 can be electrically connected to each other via the plurality of electrodes 23*a* for the crossing trench by providing the plurality of crossing trenches 23 corresponding to the plurality of pairs of capacitance adjustment trenches 22, 22. However, it is necessary to have a planar structure in which the diode trench 21 is not provided between the plurality of capacitance adjustment trenches 22.

As described above, the crossing trench 23 is provided between the plurality of capacitance adjustment trenches 22 in a plan view, whereby the plurality of capacitance adjustment electrodes 22*a* are electrically connected to each other via the electrode 23*a* for the crossing trench.

In the IGBT region 10, for example, the emitter electrode 6 and the interlayer insulating film 4 illustrated in FIGS. 2 and 3 are formed as surface structures formed on the surfaces of the IGBT contact layer 14, the emitter layer 13, and the gate electrode 11*a*. The emitter electrode 6 is set to a reference potential of a ground battery or the like by an external terminal or the like, which is not illustrated.

As illustrated in FIG. 2, the interlayer insulating film 4 is formed to cover the upper portion of the active trench 11, and the emitter electrode 6 is provided on the upper surface of the semiconductor substrate 40 including the interlayer insulating film 4. Due to the presence of the interlayer insulating film 4, insulation between the gate electrode 11*a* and the emitter electrode 6 is achieved. Since the emitter electrode 6 is formed on the opening region 18 where the interlayer insulating film 4 is not formed on the upper surface of the semiconductor substrate 40, the emitter electrode 6 is electrically connected to the emitter layer 13 and the IGBT contact layer 14.

In the IGBT region 10, as a back surface structure formed on the back surface of the drift layer 1, for example, an n-type buffer layer 3, a p-type collector layer 16, and a collector electrode 7 illustrated in FIG. 2 are formed.

In the IGBT region 10, the buffer layer 3 is provided on the lower surface on the −Z direction side, that is on the second main surface S2 side, of the drift layer 1, and the collector layer 16 is provided on the lower surface of the buffer layer 3. Further, the collector electrode 7 is provided on the lower surface of the collector layer 16.

An IGBT including the emitter electrode 6, the IGBT contact layer 14, the emitter layer 13, the base layer 15, the drift layer 1, the buffer layer 3, the collector layer 16, the collector electrode 7, the gate electrode 11$a$, and the gate insulating film 11$b$ as main constituent elements is provided in the IGBT region 10.

In such a configuration, the IGBT operates by applying a positive voltage to the gate electrode 11$a$, forming an n-type channel region in a part of the base layer 15, and applying a positive voltage to the collector electrode 7.

Next, the structure of the diode region 20 will be described with reference to FIGS. 1 to 3. In the diode region 20, the drift layer 1, the carrier accumulation layer 2, the anode layer 25, the diode contact layer 24, the diode trench 21, the plurality of capacitance adjustment trenches 22, and the plurality of crossing trenches 23 are provided in the semiconductor substrate 40.

The drift layer 1 and the carrier accumulation layer 2 are shared between the diode region 20 and the IGBT region 10.

In the diode region 20, the emitter electrode 6 and the interlayer insulating film 4 illustrated in FIGS. 2 and 3 are formed as a surface structure formed on the surface of the semiconductor substrate 40 including the diode contact layer 24, the anode layer 25, the diode trench 21, the capacitance adjustment trench 22, and the crossing trench 23.

As illustrated in FIGS. 2 and 3, the interlayer insulating film 4 is formed so as to cover the upper portion of each of the diode trench 21, the plurality of capacitance adjustment trenches 22, and the plurality of crossing trenches 23, and the emitter electrode 6 is provided on the upper surface of the semiconductor substrate 40 including the interlayer insulating film 4. The presence of the interlayer insulating film 4 insulates the diode electrode 21$a$, the capacitance adjustment electrode 22$a$, and the electrode 23$a$ for the crossing trench from the emitter electrode 6.

The diode electrode 21$a$ is electrically connected to the emitter electrode 6 in a region not illustrated in FIGS. 1 to 3.

Since the emitter electrode 6 is formed on the opening region 18 where the interlayer insulating film 4 is not formed on the upper surface of the semiconductor substrate 40, the emitter electrode 6 in the diode region 20 is electrically connected to the diode contact layer 24.

The emitter electrode 6 is an electrode shared by the IGBT region 10 and the diode region 20. As a material of the emitter electrode 6, for example, an aluminum alloy is conceivable.

In the diode region 20, as a back surface structure formed on the back surface of the drift layer 1, the n-type buffer layer 3, an n$^+$-type cathode layer 26, and a collector electrode 7 illustrated in FIGS. 2 and 3 are provided.

In the diode region 20, the buffer layer 3 is provided on the lower surface on the −Z direction side, that is on the second main surface S2 side, of the drift layer 1, and the cathode layer 26 is provided on the lower surface of the buffer layer 3. The collector electrode 7 is provided on the lower surface of the cathode layer 26.

The n-type buffer layer 3 and the collector electrode 7 can be shared between the IGBT region 10 and the diode region 20. Note that the cathode layer 26 is used in the diode region 20.

A diode including the emitter electrode 6, the anode layer 25, the drift layer 1, the carrier accumulation layer 2, the buffer layer 3, the cathode layer 26, and the collector electrode 7 as main constituent elements is provided in the diode region 20. In the diode region 20, the emitter electrode 6 functions as an anode electrode, and the collector electrode 7 functions as a cathode electrode.

As described above, the drift layer 1, the carrier accumulation layer 2, the buffer layer 3, the emitter electrode 6, and the collector electrode 7 are shared between the IGBT region 10 and the diode region 20. On the other hand, the base layer 15, the emitter layer 13, the IGBT contact layer 14, and the collector layer 16 are used in the IGBT region 10, and the diode contact layer 24, the anode layer 25, and the cathode layer 26 are used in the diode region 20.

The crossing trench 23 is shared between the IGBT region 10 and the diode region 20, the active trench 11 is used in the IGBT region 10, and the diode trench 21 and the capacitance adjustment trench 22 are used in the diode region 20.

(Effects)

In the semiconductor device 81 of the first preferred embodiment, the gate electrode 11$a$ of the adjacent active trench 11$y$ provided in the IGBT region 10 has a gate connection structure electrically connected to the capacitance adjustment electrode 22$a$ of the adjacent capacitance adjustment trench 22$x$ provided in the diode region 20 via the electrode 23$a$ for the crossing trench provided in the semiconductor substrate 40.

For each of the plurality of capacitance adjustment trenches 22, a portion where the capacitance adjustment electrode 22$a$ faces the anode layer 25 via the capacitance adjustment insulating film 22$b$ contributes as the gate-emitter capacitance Cge of the IGBT, and a portion where the capacitance adjustment electrode 22$a$ faces the carrier accumulation layer 2 or the drift layer 1 via the capacitance adjustment insulating film 22$b$ contributes as the gate-collector capacitance Cgc of the IGBT. Note that the input capacitance means a total value of the gate-emitter capacitance Cge and the gate-collector capacitance Cgc of the IGBT.

Therefore, according to the gate connection structure of the semiconductor device 81, the input capacitance of the IGBT formed in the IGBT region 10 can be increased at least by the amount that the capacitance adjustment electrode 22$a$ of the adjacent capacitance adjustment trench 22$x$ can be used as the input capacitance of the IGBT.

Therefore, in the semiconductor device 81 of the first preferred embodiment, the input capacitance of the IGBT formed in the IGBT region 10 can be increased with the minimum number of active trenches 11 without increasing the number of active trenches 11, and the gate leakage current in the IGBT can be suppressed.

In the present disclosure, it is assumed that a current change indicated by di/dt is rate-limiting, and a main object is to obtain an IGBT having a switching characteristic in which a voltage change indicated by dv/dt is increased. Therefore, in order to increase the ratio of the input capacitance to the feedback capacitance in the IGBT, the semiconductor device of the present disclosure has an effect of increasing the input capacitance. Note that the "feedback capacitance" is a gate-collector parasitic capacitance Cgc in the IGBT.

Next, the effect of suppressing the gate leakage current will be described. In the conventional semiconductor device, in order to electrically connect the gate electrode and the capacitance adjustment electrode, an electrical connection member such as a gate extraction electrode is provided on the end regions of the active trench and the capacitance adjustment trench. For this reason, the conventional semiconductor device has a gate electrode structure in which the electric field concentration is likely to occur from the electrical connection member to the end region of the active trench or the capacitance adjustment trench when the gate voltage of the IGBT is applied.

As a result, the conventional semiconductor device has a problem that the above-described electric field concentration causes an increase in gate leakage current.

On the other hand, in the semiconductor device 81 of the first preferred embodiment, since the electrode 23a for the crossing trench provided in the semiconductor substrate 40 is used as the electrical connection member, there is no possibility of the above-described electric field concentration, and the gate leakage current can be suppressed.

In the semiconductor device 81 of the first preferred embodiment, the plurality of capacitance adjustment electrodes 22a provided in the diode region 20 are electrically connected to each other via the electrode 23a for the crossing trench.

Therefore, in the semiconductor device 81 of the first preferred embodiment, since the plurality of capacitance adjustment electrodes 22a can be used as the input capacitance of the IGBT, the input capacitance of the IGBT formed in the IGBT region 10 can be further increased.

An interlayer insulating film 4 is provided in an upper layer of the capacitance adjustment electrode 22a and the electrode 23a for the crossing trench, and neither of the capacitance adjustment electrode 22a and the electrode 23a for the crossing trench have an electrical connection relationship with the emitter layer 13 or the emitter electrode 6.

Therefore, since a parasitic nMOSFET in which the capacitance adjustment electrode 22a and the electrode 23a for the crossing trench serve as a gate electrode and the cathode layer 26 serves as an electrode region is not formed, an increase in the on-voltage during diode operation can be suppressed.

(Manufacturing Method)

The method of manufacturing the semiconductor device 81 according to the first preferred embodiment includes the following steps (a) to (d), and executes the steps (a) to (d) to form the active trench 11, the diode trench 21, the capacitance adjustment trench 22, and the crossing trench 23 before completion.

Step (a): forming the active trench 11;

Step (b): forming the diode trench 21;

Step (c): forming the capacitance adjustment trench 22; and

Step (d): forming the crossing trench 23, the steps (a) to (d) being carried out simultaneously. Therefore, the trenches 11, 21 to 23 before completion are formed with substantially the same formation depth.

For example, steps (a) to (d) can be simultaneously executed by an existing manufacturing method in which an oxide film such as SiO$_2$ is deposited on the semiconductor substrate 40, openings are then formed in the oxide film in portions where the trenches 11, 21 to 23 before completion are to be formed by mask processing, and the semiconductor substrate 40 is etched as a mask in which the openings are formed.

Note that the trenches 11, 21 to 23 can be completed through, for example, the following steps. The semiconductor substrate 40 is heated in an atmosphere containing oxygen to form an oxide film on the inner walls of the trenches 11, 21 to 23 and the first main surface S1 of the semiconductor substrate 40. In this example, an oxide film is employed as the insulating film.

Of the oxide films formed on the inner walls of the trenches 11, 21 to 23, the oxide film in the active trench 11 serves as the gate insulating film 11b, and the oxide film formed in the diode trench 21 serves as the diode insulating film 21b. Similarly, the oxide film formed in the capacitance adjustment trench 22 serves as the capacitance adjustment insulating film 22b, and the oxide film formed in the crossing trench 23 serves as the insulating film 23b for the crossing trench. The oxide film formed on the first main surface S1 of the semiconductor substrate 40 is removed in a later step.

Next, polysilicon doped with n-type or p-type impurities is deposited using a chemical vapor deposition (CVD) method or the like in the trenches 11, 21 to 23 in which the oxide film is formed on the inner wall, to form the gate electrode 11a, the diode electrode 21a, the capacitance adjustment electrode 22a, and the electrode 23a for the crossing trench.

In the method of manufacturing the semiconductor device 81 according to the first preferred embodiment, by simultaneously carrying out the above-described steps (a) to (d), the semiconductor device 81 including the active trench 11, the diode trench 21, the capacitance adjustment trench 22, and the crossing trench 23 can be manufactured without increasing the number of manufacturing steps.

Second Preferred Embodiment

FIG. 4 is a cross-sectional view illustrating a cross-sectional structure of a semiconductor device 82 according to a second preferred embodiment of the present disclosure. FIG. 4 corresponds to the A-A cross-sectional structure of FIG. 1 described in the first preferred embodiment. An XYZ orthogonal coordinate system is illustrated in FIG. 4.

Hereinafter, the same structures as those of the semiconductor device 81 of the first preferred embodiment illustrated in FIGS. 1 to 3 will be denoted by the same reference numerals, description thereof will be omitted as appropriate, and feature portions of the semiconductor device 82 of the second preferred embodiment will be mainly described.

As illustrated in FIG. 4, the semiconductor device 82 has a structure in which the carrier accumulation layer 2 and the anode layer 25 are replaced with the anode layer 25B in the diode region 20.

The anode layer 25B is provided adjacent to the first main surface S1 of the drift layer 1. That is, the lower surface of the anode layer 25B coincides with the upper surface of the drift layer 1. As described above, the anode layer 25B has a formation depth with respect to the combined structure of the anode layer 25 and the carrier accumulation layer 2 of the first preferred embodiment.

As illustrated in FIG. 4, each of the diode trench 21 and the plurality of capacitance adjustment trenches 22 is provided in a region that penetrates the anode layer 25B from the first main surface S1 and reaches a part of the drift layer 1.

Furthermore, the anode layer 25B provided in the diode region 20 has a relatively large formation depth on the second main surface S2 side as compared with the base layer 15. That is, the anode layer 25B is formed deeper than the base layer 15 by the film thickness of the carrier accumulation layer 2 of the first preferred embodiment.

In the semiconductor device 82 of the second preferred embodiment, the anode layer 25B provided in the diode region 20 has a structure having a relatively large formation depth as compared with the base layer 15 provided in the IGBT region 10. Therefore, the semiconductor device 82 of the second preferred embodiment can increase the input capacitance of the IGBT.

Hereinafter, the reason why the input capacitance of the IGBT can be increased will be described. The gate-emitter parasitic capacitance Cge, which is a part of the input capacitance, is proportional to the contact area between the anode layer 25B and the capacitance adjustment trench 22. Therefore, as the formation depth of the anode layer 25B becomes deeper than that of the base layer 15, the contact area increases, whereby the input capacitance of the IGBT increases.

The method of manufacturing the semiconductor device 82 according to the second preferred embodiment can simultaneously carry out steps (a) to (d) similar to those in the first preferred embodiment, and can achieve effects similar to those in the first preferred embodiment.

Third Preferred Embodiment

FIG. 5 is a cross-sectional view illustrating a cross-sectional structure of a semiconductor device 83 according to a third preferred embodiment of the present disclosure. FIG. 5 corresponds to the A-A cross-sectional structure of FIG. 1 described in the first preferred embodiment. An XYZ orthogonal coordinate system is illustrated in FIG. 5.

Hereinafter, the same structures as those of the semiconductor device 81 of the first preferred embodiment illustrated in FIGS. 1 to 3 or the semiconductor device 82 of the second preferred embodiment illustrated in FIG. 4 will be denoted by the same reference numerals, description thereof will be omitted as appropriate, and feature portions of the semiconductor device 83 of the third preferred embodiment will be mainly described. As illustrated in FIG. 5, in the semiconductor device 83 of the third preferred embodiment, the plurality of capacitance adjustment trenches are classified into an adjacent capacitance adjustment trench 22x and a capacitance adjustment trench 32. The adjacent capacitance adjustment trench 22x is a trench provided in a position closest to the active trench 11. The capacitance adjustment trench 32 functions as an intermediate capacitance adjustment trench other than the capacitance adjustment trench 22.

In the capacitance adjustment trenches 32, a capacitance adjustment electrode 32a is embedded via a capacitance adjustment insulating film 32b. Hereinafter, in the description of the device structure, regarding the capacitance adjustment trench 32, the completed structure including the capacitance adjustment electrode 32a and the capacitance adjustment insulating film 32b may be simply referred to as a "capacitance adjustment trench 32".

The crossing trench 23 is provided between the adjacent capacitance adjustment trench 22x and the capacitance adjustment trench 32 in a plan view, and the capacitance adjustment electrode 22a of the adjacent capacitance adjustment trench 22x and the capacitance adjustment electrode 32a of the capacitance adjustment trench 32 are electrically connected via the electrode 23a for the crossing trench.

The adjacent capacitance adjustment trench 22x has a first depth. The first depth is a depth that penetrates the anode layer 25B from the first main surface S1 side and reaches a part of the drift layer 1.

On the other hand, the capacitance adjustment trench 32, which is an intermediate capacitance adjustment trench, has a bottom surface provided in the anode layer 25B with a second depth. That is, the second depth of the capacitance adjustment trench 32 is shallower than the first depth of the capacitance adjustment trench 22. Therefore, the capacitance adjustment trenches 22 and 32 in the semiconductor device 83 of the third preferred embodiment are provided from the first main surface S1 side to at least a part of the anode layer 25B.

The semiconductor device 83 of the third preferred embodiment can reduce the feedback capacitance value by the plurality of capacitance adjustment electrodes in the IGBT by setting the formation depth of the capacitance adjustment trench 32 that is the intermediate capacitance adjustment trench among the plurality of capacitance adjustment trenches to the second depth. The plurality of capacitance adjustment electrodes include the capacitance adjustment electrode 22a of the adjacent capacitance adjustment trench 22x and the capacitance adjustment electrode 32a of the capacitance adjustment trench 32.

Since the bottom of the capacitance adjustment trench 32 illustrated in FIG. 5 exists in the anode layer 25B, the feedback capacitance in the capacitance adjustment trench 32 is substantially "0".

As a result, the semiconductor device 82 according to the third preferred embodiment can reduce the turn-on rise time, the turn-off fall time, and the power loss by reducing the feedback capacitance in the IGBT.

In addition, since the adjacent capacitance adjustment trench 22x has the first depth that penetrates the anode layer 25B and reaches a part of the drift layer 1, it is possible to suppress a decrease in breakdown voltage of the semiconductor device 83.

That is, by depleting the region sandwiched between the adjacent active trench 11y and the adjacent capacitance adjustment trench 22x, a decrease in the breakdown voltage of the semiconductor device 83 can be suppressed. Specifically, the sandwiched region corresponds to the carrier accumulation layer 2 and the base layer 15.

Although only one capacitance adjustment trench 32 is illustrated as the intermediate capacitance adjustment trench in FIG. 5, a plurality of intermediate capacitance adjustment trenches may be formed. In this case, at least one of the plurality of intermediate capacitance adjustment trenches may be formed with the second depth as with the capacitance adjustment trench 32, and the other intermediate capacitance adjustment trenches may be formed with the first depth as with the capacitance adjustment trench 22.

The method of manufacturing the semiconductor device 83 according to the third preferred embodiment can simultaneously carry out steps (a) to (d) similar to those in the first preferred embodiment, and can achieve effects similar to those in the first preferred embodiment.

However, since the formation depth of the capacitance adjustment trench 32 is different from those of the trenches 11, 21 to 23, it is desirable to form the capacitance adjustment trench 32 at a timing different from that of steps (a) to (d). Note that the active trench 11, the diode trench 21, and the crossing trench 23 are formed with the first depth.

Fourth Preferred Embodiment

FIG. 6 is a cross-sectional view illustrating a cross-sectional structure of a semiconductor device 84 according to a fourth preferred embodiment of the present disclosure. FIG. 6 corresponds to the A-A cross-sectional structure of FIG. 1 described in the first preferred embodiment. An XYZ orthogonal coordinate system is illustrated in FIG. 6.

Hereinafter, the same structures as those of the semiconductor device 81 of the first preferred embodiment illustrated in FIGS. 1 to 3 or the semiconductor device 82 of the second preferred embodiment illustrated in FIG. 4 will be denoted by the same reference numerals, description thereof will be omitted as appropriate, and feature portions of the semiconductor device 84 of the fourth preferred embodiment will be mainly described.

As illustrated in FIG. 6, the adjacent active trenches 11 and 11 of the plurality of active trenches 11 are uniformly arranged with an active trench pitch P1 as a first interval therebetween. That is, the plurality of active trenches 11 are discretely arranged at equal intervals along the X direction.

As illustrated in FIG. 6, among the plurality of capacitance adjustment trenches 22, the adjacent capacitance adjustment trenches 22, 22 are arranged with a capacitance adjustment trench pitch P2 that is a second interval. That is, the plurality of capacitance adjustment trenches 22 are discretely arranged at equal intervals along the X direction. The capacitance adjustment trench pitch P2, which is the second interval, is narrower than the active trench pitch P1, which is the first interval.

In the semiconductor device 84 of the fourth preferred embodiment, the adjacent capacitance adjustment trenches 22, 22 of the plurality of capacitance adjustment trenches 22 are arranged with a capacitance adjustment trench pitch P2 narrower than the active trench pitch P1 between the adjacent active trenches 11, 11.

Therefore, in the semiconductor device 84 of the fourth preferred embodiment, the plurality of capacitance adjustment trenches 22 can be provided in a total number larger than the total number of the plurality of active trenches 11 for the formation region having the same area.

As a result, the semiconductor device 54 according to the fourth preferred embodiment can increase the input capacitance of the IGBT by an amount corresponding to an increase in the total number of the plurality of capacitance adjustment trenches 22.

The method of manufacturing the semiconductor device 84 according to the fourth preferred embodiment can simultaneously carry out steps (a) to (d) similar to those in the first preferred embodiment, and can achieve effects similar to those in the first preferred embodiment.

However, it is necessary to execute steps (a) and (c) by setting a pattern of openings such that the active trench pitch P1 between the adjacent active trenches 11, 11 is different from the capacitance adjustment trench pitch P2 between the adjacent capacitance adjustment trenches 22, 22.

Fifth Preferred Embodiment

FIG. 7 is a cross-sectional view illustrating a cross-sectional structure of a semiconductor device 85 according to a fifth preferred embodiment of the present disclosure. FIG. 7 corresponds to the A-A cross-sectional structure of FIG. 1 described in the first preferred embodiment. An XYZ orthogonal coordinate system is illustrated in FIG. 7.

Hereinafter, the same structures as those of the semiconductor device 81 of the first preferred embodiment illustrated in FIGS. 1 to 3 or the semiconductor device 82 of the second preferred embodiment illustrated in FIG. 4 will be denoted by the same reference numerals, description thereof will be omitted as appropriate, and feature portions of the semiconductor device 85 of the fifth preferred embodiment will be mainly described.

As illustrated in FIG. 7, the semiconductor device 85 according to the fifth preferred embodiment is characterized in that the plurality of capacitance adjustment trenches 22 is replaced with a plurality of capacitance adjustment trenches 42. Note that the adjacent capacitance adjustment trench 42x corresponds to the adjacent capacitance adjustment trench 22x and is provided in a position closest to the boundary L12.

Similarly to the capacitance adjustment trenches 22 of the second preferred embodiment, each of the plurality of capacitance adjustment trenches 42 is provided in a region that penetrates the anode layer 25 from the first main surface S1 side of the semiconductor substrate 40 and reaches a part of the drift layer 1.

In the capacitance adjustment trenches 42, a capacitance adjustment electrode 42a is embedded via a capacitance adjustment insulating film 42b. Hereinafter, in the description of the device structure, regarding the capacitance adjustment trench 42, the completed structure including the capacitance adjustment electrode 42a and the capacitance adjustment insulating film 42b may be simply referred to as a "capacitance adjustment trench 42".

As in the first preferred embodiment, each of the plurality of crossing trenches 23 is provided from the adjacent capacitance adjustment trench 42x to the adjacent active trench 11y in a plan view, and the gate electrode 11a of the adjacent active trench 11y and the capacitance adjustment electrode 42a of the adjacent capacitance adjustment trench 42x are electrically connected via the electrode 23a for the crossing trench in the crossing trench 23.

In addition, similarly to the first preferred embodiment, the crossing trench 23 is provided between the plurality of capacitance adjustment trenches 42 in a plan view, whereby the plurality of capacitance adjustment electrodes 42a are electrically connected to each other via the electrode 23a for the crossing trench.

The gate insulating film 11b of the active trench 11 has a first film thickness. Similarly, the diode insulating film 21b of the diode trench 21 has the first film thickness. On the other hand, the capacitance adjustment insulating film 42b of the capacitance adjustment trench 42 has a second film thickness smaller than the first film thickness. Similarly, the insulating film 23b for the crossing trench of the crossing trench 23 (not illustrated in FIG. 7) also has the second film thickness.

In the semiconductor device 85 of the fifth preferred embodiment, the capacitance adjustment insulating film 42b and the insulating film 23b for the crossing trench have the second film thickness smaller than the first film thickness of the diode insulating film 21b, so that the input capacitance in the IGBT can be increased.

This is because, in each of the plurality of capacitance adjustment trenches 42, the capacitance component contributing as the input capacitance of the IGBT increases as the capacitance adjustment insulating film 42b is formed to have the small film thickness. Similarly, in each of the plurality of crossing trenches 23, the capacitance component contributing as the input capacitance of the IGBT increases as the insulating film 23b for the crossing trench is formed to have the small film thickness.

The method of manufacturing the semiconductor device 85 according to the fifth preferred embodiment can simultaneously carry out steps (a) to (d) similar to those in the first preferred embodiment, and can achieve effects similar to those in the first preferred embodiment.

However, in step (c), the capacitance adjustment trench 42 is formed instead of the capacitance adjustment trench 22, and the film thickness of the insulating film 23b for the crossing trench in the crossing trench 23 is set to the second film thickness.

Note that the trenches 11, 21, 42, and 23 are completed through, for example, the following steps. Here, an oxide film is employed as the insulating film.

The semiconductor substrate 40 is heated in an atmosphere containing oxygen to form an oxide film on the inner walls of the trenches 11, 21, 42, and 23 and the first main surface S1 of the semiconductor substrate 40. The oxide film in the capacitance adjustment trench 42 serves as the capacitance adjustment insulating film 42*b*, and the oxide film in the crossing trench 23 serves as the insulating film 23*b* for the crossing trench. The capacitance adjustment insulating film 42*b* and the insulating film 23*b* for the crossing trench are manufactured so as to have the above-described second film thickness.

As described above, in the fifth preferred embodiment, the insulating film 23*b* for the crossing trench is formed to have the second film thickness that is the same as the film thickness of the capacitance adjustment insulating film 42*b*.

Next, polysilicon doped with an n-type or p-type impurity is deposited in the trenches 11, 21, 42, and 23 in which the oxide film is formed on the inner wall by using a CVD method or the like, the capacitance adjustment electrode 42*a* is formed in the capacitance adjustment trench 42, and the electrode 23*a* for the crossing trench is formed in the crossing trench 23. At this time, an electrode material is also embedded in each of the active trench 11 and the diode trench 21.

Thereafter, the upper surface of the capacitance adjustment trench 42 and the upper surface of the crossing trench 23 are covered with a resist by photolithography processing, and then an oxide film and an electrode material formed inside the active trench 11 and the diode trench 21 are removed.

After the resist is removed, the gate insulating film 11*b* and the gate electrode 11*a* are formed in the active trench 11, and the diode insulating film 21*b* and the diode electrode 21*a* are formed in the diode trench 21 by using the above-described oxide film forming method and the CVD method. At this time, the gate insulating film 11*b* and the diode insulating film 21*b* are manufactured so as to have the first film thickness described above.

As another manufacturing method of the trench structure of the fifth preferred embodiment, a method is conceivable in which the first trench group is the active trench 11 and the diode trench 21, the second trench group is the capacitance adjustment trench 42 and the crossing trench 23, and the first trench group and the second trench group are manufactured by separate processes.

Sixth Preferred Embodiment

FIG. 8 is a plan view illustrating a planar structure of a semiconductor device 86 according to a sixth preferred embodiment of the present disclosure as viewed from above. An XYZ orthogonal coordinate system is illustrated in FIG. 8. In FIG. 8, illustration of an interlayer insulating film 4 and an emitter electrode 6, which are structures on the upper surface of a semiconductor substrate 40, is omitted.

Hereinafter, the same structures as those of the semiconductor device 81 of the first preferred embodiment illustrated in FIGS. 1 to 3 will be denoted by the same reference numerals, description thereof will be omitted as appropriate, and feature portions of the semiconductor device 86 of the sixth preferred embodiment will be mainly described.

As illustrated in FIG. 8, the semiconductor device 86 according to the sixth preferred embodiment is different from the semiconductor device 81 according to the first preferred embodiment in that the diode trench 21 is replaced with a diode trench 31, the capacitance adjustment trench 22 is replaced with a capacitance adjustment trench 52, and the crossing trench 23 is replaced with a crossing trench 33.

Similarly to the diode trench 21 of the first preferred embodiment, each of the plurality of diode trenches 31 is provided in a region that penetrates the anode layer 25 and the carrier accumulation layer 2 from the first main surface S1 side of the semiconductor substrate 40 and reaches a part of the drift layer 1.

A diode electrode 31*a* is embedded in each of the plurality of diode trenches 31 via a diode insulating film 31*b*. The diode insulating film 31*b* is formed on the inner wall of the diode trench 31. Hereinafter, in the description of the device structure, regarding the diode trench 31, the completed structure including the diode electrode 31*a* and the diode insulating film 31*b* may be simply referred to as "diode trench 31".

Although only one capacitance adjustment trench 52 is illustrated in FIG. 8, actually, a plurality of capacitance adjustment trenches 52 are provided in the diode region 20. Hereinafter, a description will be given on the assumption that a plurality of capacitance adjustment trenches 52 are formed in the diode region 20.

Similarly to the plurality of capacitance adjustment trenches 22 of the first preferred embodiment, each of the plurality of capacitance adjustment trenches 52 is provided in a region that penetrates the anode layer 25 and the carrier accumulation layer 2 from the first main surface S1 side of the semiconductor substrate 40 and reaches a part of the drift layer 1.

In each of the plurality of capacitance adjustment trenches 52, a capacitance adjustment electrode 52*a* is embedded via a capacitance adjustment insulating film 52*b*. Hereinafter, in the description of the device structure, regarding the capacitance adjustment trench 52, the completed structure including the capacitance adjustment electrode 52*a* and the capacitance adjustment insulating film 52*b* may be simply referred to as a "capacitance adjustment trench 52".

Similarly to the crossing trench 23 of the first preferred embodiment, each of the plurality of crossing trenches 33 is provided in a region that penetrates the base layer 15 or the anode layer 25 and the carrier accumulation layer 2 from the first main surface S1 side of the semiconductor substrate 40 and reaches a part of the drift layer 1.

An electrode 33*a* for the crossing trench is embedded in each of the plurality of crossing trenches 33 via the insulating film 33*b* for the crossing trench. Note that the capacitance adjustment insulating film 22*b* is formed on the inner wall of the crossing trench 33. Hereinafter, in the description of the device structure, regarding the crossing trench 33, the completed structure including the electrode 33*a* for the crossing trench and the insulating film 33*b* for the crossing trench may be simply referred to as a "crossing trench 33".

As illustrated in FIG. 8, the diode trench 31 is provided in a position closest to the active trench 11 of the plurality of diode trenches 31 and the plurality of capacitance adjustment trenches 52.

That is, the plurality of diode trenches 31 includes the adjacent diode trench 31*x* provided in the position closest to the adjacent active trench 11*y*, and the plurality of capacitance adjustment trenches 52 includes the adjacent capacitance adjustment trench 52*x* adjacent to the adjacent diode trench 31*x* in the direction away from the adjacent active trench 11*y*.

As described above, the semiconductor device 86 according to the sixth preferred embodiment has a planar structure in which the adjacent diode trench 31x is adjacent to the adjacent active trench 11y and the adjacent capacitance adjustment trench 52x is not adjacent thereto.

As illustrated in FIG. 8, each of the plurality of diode trenches 31 is provided in a stripe shape extending in the Y direction in a plan view. Similarly, the plurality of capacitance adjustment trenches 52 extend in the Y direction in a plan view and is provided in a stripe shape.

Further, as illustrated in FIG. 8, each of the plurality of diode trenches 31 includes partial trenches 311 to 313 as a plurality of partial trenches provided discretely with the trench-non-formed region 300 interposed therebetween.

On the other hand, each of the plurality of crossing trenches 33 extends in the X direction orthogonal to the Y direction in a plan view and is provided in a stripe shape. Similarly, each of the plurality of crossing trenches 33 is provided from the adjacent capacitance adjustment trench 52x to the adjacent active trench 11y in a plan view, and the gate electrode 11a of the adjacent active trench 11y and the capacitance adjustment electrode 52a of the adjacent capacitance adjustment trench 52x are electrically connected via the electrode 33a for the crossing trench in the crossing trench 33.

Further, the crossing trench 33 is provided to intersect with the trench-non-formed region 300 of the adjacent diode trench 31x in a plan view. That is, the crossing trench 33 is provided from the adjacent capacitance adjustment trench 52x to the adjacent active trench 11y so as to cross the trench-non-formed region 300 in a plan view.

As described above, since the crossing trench 33 is provided so as to intersect with the trench-non-formed region 300, the electrode 33a for the crossing trench and the diode electrode 31a of the adjacent diode trench 31x do not have an electrical connection relationship.

Therefore, the crossing trench 33 is provided from the adjacent capacitance adjustment trench 52x to the adjacent active trench 11y in a plan view, the capacitance adjustment electrode 52a of the adjacent capacitance adjustment trench 52x and the gate electrode 11a of the adjacent active trench 11y are electrically connected via the electrode 33a for the crossing trench, and the diode electrode 31a of the adjacent diode trench 31x and the electrode 33a for the crossing trench do not have an electrical connection relationship.

In addition, similarly to the first preferred embodiment, each of the plurality of crossing trenches 33 is provided between the plurality of capacitance adjustment trenches 52, 52 in a plan view, and the capacitance adjustment electrodes 52a are electrically connected to each other between the capacitance adjustment trenches 52, 52 adjacent in the X direction via the electrode 33a for the crossing trench in the crossing trench 33. Specifically, the crossing trench 33 is formed between a pair of adjacent capacitance adjustment trenches 52, 52, and is provided so as to intersect with the trench-non-formed region 300 of the diode trench 31 in a plan view.

In the semiconductor device 86 of the sixth preferred embodiment, the adjacent diode trench 31x is provided in a position closest to the active trench 11 of the plurality of diode trenches 31 and the plurality of capacitance adjustment trenches 52.

Therefore, in the semiconductor device 86 according to the sixth preferred embodiment, the capacitance balance in the diode region 20 can be equalized as the plurality of capacitance adjustment trenches 52 can be formed in the center region of the diode region 20.

By equalizing the capacitance balance in the diode region 20, it is possible to suppress a current imbalance phenomenon in which current is locally concentrated in the diode region 20.

Since the plurality of crossing trenches 33 in the semiconductor device 86 according to the sixth preferred embodiment is provided so as to intersect with the trench-non-formed region 300 in a plan view, the crossing trenches 33 do not intersect with any of the partial trenches 311 to 313 which are the plurality of partial trenches in a plan view.

Therefore, in the semiconductor device 86 according to the sixth preferred embodiment, the plurality of crossing trenches 33 can be formed relatively easily so that the electrode 33a for the crossing trench and the diode electrode 31a are not electrically connected.

As described above, even if the adjacent diode trench 31x exists between the adjacent active trench 11y and the adjacent capacitance adjustment trench 52x in a plan view, the diode electrode 31a of the adjacent diode trench 31x does not have an electrical connection relationship with the electrode 33a for the crossing trench and the capacitance adjustment electrode 52a.

Note that, as an arrangement relationship between the plurality of diode trenches 31 and the plurality of capacitance adjustment trenches 52 in the diode region 20, for example, a planar structure in which the diode trenches 31 and the capacitance adjustment trenches 52 are alternately formed for every i (i=any one of 1 to N (>1)) trenches is conceivable.

The method of manufacturing the semiconductor device 86 according to the sixth preferred embodiment can simultaneously carry out steps (a) to (d) similar to those in the first preferred embodiment, and can achieve effects similar to those in the first preferred embodiment.

However, in step (b), a diode trench 31 is formed instead of the diode trench 21. Similarly, in step (c), the capacitance adjustment trench 52 is formed instead of the capacitance adjustment trench 22, and in step (d), the crossing trench 33 is formed instead of the crossing trench 23.

Others

Note that, in the present disclosure, each preferred embodiment can be freely combined, and each preferred embodiment can be appropriately modified or omitted within the scope of the disclosure.

For example, as the semiconductor substrate 40, a substrate to which a withstand voltage class is set, an FZ (Float Zone) substrate, an MCZ (Magnetic field applied CZ (Czochralski)) substrate, an epitaxial substrate, and the like are conceivable. However, substrates applicable as the semiconductor substrate 40 are not limited to the above-described substrates. The features of each preferred embodiment can also be partially applied to other preferred embodiments.

In addition, the structures described in the third to fifth preferred embodiments may be provided in the diode region 20 of the first preferred embodiment including the anode layer 25 and the carrier accumulation layer 2.

In the above-described preferred embodiment, the planar structure of the active trenches 11 and 21, the diode trenches 21 and 31, and the capacitance adjustment trenches 22, 32, 42, and 52 is formed in a stripe shape. The present invention is not limited to this planar structure, and for example, the planar structure of the trenches 11, 21, 21, 31, 22, 32, 42, and 52 described above may be formed in an island shape.

Hereinafter, aspects of the present disclosure will be collectively described as Appendixes.

APPENDIX 1

A semiconductor device including an IGBT region having an IGBT therein and a diode region having a diode therein, the semiconductor device comprising:

a semiconductor substrate having first and second main surfaces;

a drift layer of a first conductivity type provided in the semiconductor substrate;

a base layer of a second conductivity type provided in the semiconductor substrate and selectively disposed on a first main surface side with respect to the drift layer;

an anode layer of the second conductivity type provided in the semiconductor substrate and selectively disposed on the first main surface side with respect to the drift layer; and an emitter electrode provided on the first main surface of the semiconductor substrate, wherein the drift layer and the emitter electrode are shared between the IGBT region and the diode region, the base layer is used in the IGBT region, the anode layer is used in the diode region, the semiconductor device further comprising:

an active trench provided in a region that penetrates the base layer from the first main surface side and reaches a part of the drift layer;

a diode trench provided in a region that penetrates the anode layer from the first main surface side and reaches a part of the drift layer;

a capacitance adjustment trench provided from the first main surface side to at least a part of the anode layer; and a crossing trench provided in a region that penetrates the base layer or the anode layer from the first main surface side and reaches a part of the drift layer, wherein the crossing trench is shared between the IGBT region and the diode region, the active trench is used in the IGBT region, the diode trench and the capacitance adjustment trench are used in the diode region, a gate electrode is embedded in the active trench via a gate insulating film, a diode electrode is embedded in the diode trench via a diode insulating film, a capacitance adjustment electrode is embedded in the capacitance adjustment trench via a capacitance adjustment insulating film, an electrode for the crossing trench is embedded in the crossing trench via an insulating film for the crossing trench, the diode electrode is electrically connected to the emitter electrode, and the crossing trench is provided from the capacitance adjustment trench to the active trench in a plan view; and the gate electrode and the capacitance adjustment electrode are electrically connected via the electrode for the crossing trench.

APPENDIX 2

The semiconductor device according to Appendix 1, wherein the capacitance adjustment trench includes a plurality of capacitance adjustment trenches, the capacitance adjustment electrode includes a plurality of capacitance adjustment electrodes corresponding to the plurality of capacitance adjustment trenches, and the crossing trench is provided between the plurality of capacitance adjustment trenches in a plan view; and the plurality of capacitance adjustment electrodes are electrically connected to each other via the electrode for the crossing trench.

APPENDIX 3

The semiconductor device according to Appendix 2, wherein the capacitance adjustment trench is provided in a region that penetrates the anode layer from the first main surface side and reaches a part of the drift layer, and the anode layer has a relatively large formation depth on the second main surface side as compared with the base layer.

APPENDIX 4

The semiconductor device according to Appendix 2 or 3, wherein the plurality of capacitance adjustment trenches include an adjacent capacitance adjustment trench provided in a position closest to the active trench and an intermediate capacitance adjustment trench other than the adjacent capacitance adjustment trench, the adjacent capacitance adjustment trench has a first depth, the first depth is a depth that penetrates the anode layer from the first main surface side and reaches a part of the drift layer, and the intermediate capacitance adjustment trench has a bottom surface provided in the anode layer with a second depth.

APPENDIX 5

The semiconductor device according to any one of Appendixes 2 to 4, wherein the active trench includes a plurality of active trenches, the gate electrode includes a plurality of gate electrodes corresponding to the plurality of active trenches, adjacent active trenches among the plurality of active trenches are arranged at a first interval, and the adjacent capacitance adjustment trenches among the plurality of capacitance adjustment trenches are arranged at a second interval smaller than the first interval.

APPENDIX 6

The semiconductor device according to any one of Appendixes 1 to 5, wherein the gate insulating film has a first film thickness, and the capacitance adjustment insulating film has a second film thickness smaller than the first film thickness.

APPENDIX 7

The semiconductor device according to any one of Appendixes 1 to 6, wherein the diode trench includes an adjacent diode trench provided in a position closest to the active trench, the capacitance adjustment trench includes an adjacent capacitance adjustment trench adjacent to the adjacent diode trench in a direction away from the active trench, and the crossing trench is provided from the adjacent capacitance adjustment trench to the active trench in a plan view, the capacitance adjustment electrode of the adjacent capacitance adjustment trench and the gate electrode are electrically connected via the electrode for the crossing trench; and the diode electrode of the adjacent diode trench and the electrode for the crossing trench do not have an electrical connection relationship.

APPENDIX 8

The semiconductor device according to Appendix 7 wherein the adjacent diode trench includes a plurality of partial trenches provided discretely with a trench-non-formed region interposed therebetween, and the crossing trench is provided to intersect with the trench-non-formed region in a plan view.

APPENDIX 9

A method of manufacturing the semiconductor device according to any one of Appendixes 1 to 8, including the steps of:

(a) forming the active trench;

(b) forming the diode trench;

(c) forming the capacitance adjustment trench; and (d) forming the crossing trench, wherein the steps (a) to (d) are carried out simultaneously.

While the disclosure has been shown and described in detail, the foregoing description is in all aspects illustrative and not restrictive. It is therefore understood that numerous modifications and variations can be devised.

What is claimed is:

1. A semiconductor device including an IGBT region having an IGBT therein and a diode region having a diode therein, the semiconductor device comprising:

a semiconductor substrate having first and second main surfaces;

a drift layer of a first conductivity type provided in the semiconductor substrate;

a base layer of a second conductivity type provided in the semiconductor substrate and selectively disposed on a first main surface side with respect to the drift layer;

an anode layer of the second conductivity type provided in the semiconductor substrate and selectively disposed on the first main surface side with respect to the drift layer; and an emitter electrode provided on the first main surface of the semiconductor substrate, wherein the drift layer and the emitter electrode are shared between the IGBT region and the diode region, the base layer is used in the IGBT region, the anode layer is used in the diode region, the semiconductor device further comprising:

an active trench provided in a region that penetrates the base layer from the first main surface side and reaches a part of the drift layer;

a diode trench provided in a region that penetrates the anode layer from the first main surface side and reaches a part of the drift layer;

a capacitance adjustment trench provided from the first main surface side to at least a part of the anode layer; and a crossing trench provided in a region that penetrates the base layer or the anode layer from the first main surface side and reaches a part of the drift layer, wherein the crossing trench is shared between the IGBT region and the diode region, the active trench is used in the IGBT region, the diode trench and the capacitance adjustment trench are used in the diode region, the capacitance adjustment trench is provided only between the active trench and the diode trench, a gate electrode is embedded in the active trench via a gate insulating film, a diode electrode is embedded in the diode trench via a diode insulating film, a capacitance adjustment electrode is embedded in the capacitance adjustment trench via a capacitance adjustment insulating film, an electrode for the crossing trench is embedded in the crossing trench via an insulating film for the crossing trench, the diode electrode is electrically connected to the emitter electrode, and the crossing trench is provided from the capacitance adjustment trench to the active trench in a plan view; and the gate electrode and the capacitance adjustment electrode are electrically connected via the electrode for the crossing trench.

2. The semiconductor device according to claim 1, wherein the capacitance adjustment trench includes a plurality of capacitance adjustment trenches, the capacitance adjustment electrode includes a plurality of capacitance adjustment electrodes corresponding to the plurality of capacitance adjustment trenches, and the crossing trench is provided between the plurality of capacitance adjustment trenches in a plan view; and the plurality of capacitance adjustment electrodes are electrically connected to each other via the electrode for the crossing trench.

3. The semiconductor device according to claim 2, wherein the capacitance adjustment trench is provided in a region that penetrates the anode layer from the first main surface side and reaches a part of the drift layer, and the anode layer has a relatively large formation depth on the second main surface side as compared with the base layer.

4. The semiconductor device according to claim 2, wherein the plurality of capacitance adjustment trenches include an adjacent capacitance adjustment trench provided in a position closest to the active trench and an intermediate capacitance adjustment trench other than the adjacent capacitance adjustment trench, the adjacent capacitance adjustment trench has a first depth, the first depth is a depth that penetrates the anode layer from the first main surface side and reaches a part of the drift layer, and the intermediate capacitance adjustment trench has a bottom surface provided in the anode layer with a second depth.

5. The semiconductor device according to claim 2, wherein the active trench includes a plurality of active trenches, the gate electrode includes a plurality of gate electrodes corresponding to the plurality of active trenches, adjacent active trenches among the plurality of active trenches are arranged at a first interval, and adjacent capacitance adjustment trenches among the plurality of capacitance adjustment trenches are arranged at a second interval smaller than the first interval.

6. The semiconductor device according to claim 1, wherein the gate insulating film has a first film thickness, and the capacitance adjustment insulating film has a second film thickness smaller than the first film thickness.

7. The semiconductor device according to claim 1, wherein the diode trench includes an adjacent diode trench provided in a position closest to the active trench, the capacitance adjustment trench includes an adjacent capacitance adjustment trench adjacent to the adjacent diode trench in a direction away from the active trench, and the crossing trench is provided from the adjacent capacitance adjustment trench to the active trench in a plan view, the capacitance adjustment electrode of the adjacent capacitance adjustment trench and the gate electrode are electrically connected via the electrode for the crossing trench, and the diode electrode of the adjacent diode trench and the electrode for the crossing trench do not have an electrical connection relationship.

8. The semiconductor device according to claim 7, wherein the adjacent diode trench includes a plurality of partial trenches provided discretely with a trench-non-formed region interposed therebetween, and the crossing trench is provided to intersect with the trench-non-formed region in a plan view.

9. A method of manufacturing the semiconductor device according to claim 1, comprising the steps of:

(a) forming the active trench;

(b) forming the diode trench;

(c) forming the capacitance adjustment trench; and (d) forming the crossing trench, wherein the steps (a) to (d) are carried out simultaneously.

\* \* \* \* \*